(12) United States Patent
Cheng et al.

(10) Patent No.: US 10,591,766 B2
(45) Date of Patent: Mar. 17, 2020

(54) DISPLAY APPARATUS

(71) Applicants: Pai-Chiao Cheng, Miao-Li County (TW); Hsia-Ching Chu, Miao-Li County (TW); Chandra Lius, Miao-Li County (TW)

(72) Inventors: Pai-Chiao Cheng, Miao-Li County (TW); Hsia-Ching Chu, Miao-Li County (TW); Chandra Lius, Miao-Li County (TW)

( * ) Notice: Subject to any disclaimer, the term of this patent is extended or adjusted under 35 U.S.C. 154(b) by 13 days.

(21) Appl. No.: 15/794,004

(22) Filed: Oct. 26, 2017

(65) Prior Publication Data
US 2018/0157099 A1 Jun. 7, 2018

(30) Foreign Application Priority Data

Dec. 6, 2016 (CN) .......................... 2016 1 1107867

(51) Int. Cl.
| | |
|---|---|
| *G02F 1/1335* | (2006.01) |
| *H01L 27/32* | (2006.01) |
| *G02F 1/1343* | (2006.01) |
| *G02F 1/1362* | (2006.01) |
| *H01L 29/786* | (2006.01) |
| *G09G 3/3225* | (2016.01) |
| *H01L 27/12* | (2006.01) |

(52) U.S. Cl.
CPC ...... *G02F 1/133512* (2013.01); *G02F 1/1343* (2013.01); *G02F 1/133514* (2013.01); *G02F 1/136209* (2013.01); *H01L 27/32* (2013.01); *H01L 27/322* (2013.01); *H01L 27/326* (2013.01); *H01L 27/3218* (2013.01); *H01L 27/3276* (2013.01); *H01L 29/7869* (2013.01); *H01L 29/78633* (2013.01); *G02F 2001/136218* (2013.01); *G09G 3/3225* (2013.01); *H01L 27/1225* (2013.01)

(58) Field of Classification Search
CPC ... G02F 1/133514; G02F 2001/136222; H01L 27/3218; H01L 27/322; H01L 27/3211
See application file for complete search history.

(56) References Cited

U.S. PATENT DOCUMENTS

| | | | | |
|---|---|---|---|---|
| 2001/0025958 | A1* | 10/2001 | Yamazaki | ........... G02F 1/13454 257/72 |
| 2016/0133681 | A1 | 5/2016 | Nam et al. | |
| 2016/0246111 | A1* | 8/2016 | Chen | ........................ H04N 9/12 |
| 2016/0291369 | A1* | 10/2016 | Park | .................. G02F 1/136209 |
| 2017/0363894 | A1* | 12/2017 | Uchida | ................. G02F 1/1368 |

* cited by examiner

*Primary Examiner* — Angela K Davison
(74) *Attorney, Agent, or Firm* — JCIPRNET

(57) ABSTRACT

A display apparatus including a substrate, a gate line, first and second driving transistors, and a color filter layer is provided. The substrate has first and second light emitting regions and a circuit region. The first light emitting region is disposed to be adjacent to the second light emitting region, and the circuit region is disposed to be adjacent to the first and second light emitting regions. The gate line is disposed in the circuit region and extends along a direction. The first and second driving transistors are respectively disposed in the circuit region, have a channel region, and corresponds to the first and second light emitting regions. The color filter layer has a main portion in the first light emitting region and an extending portion in the circuit region and connected to the main portion. The extending portion extends along the direction and overlaps the channel regions.

14 Claims, 9 Drawing Sheets

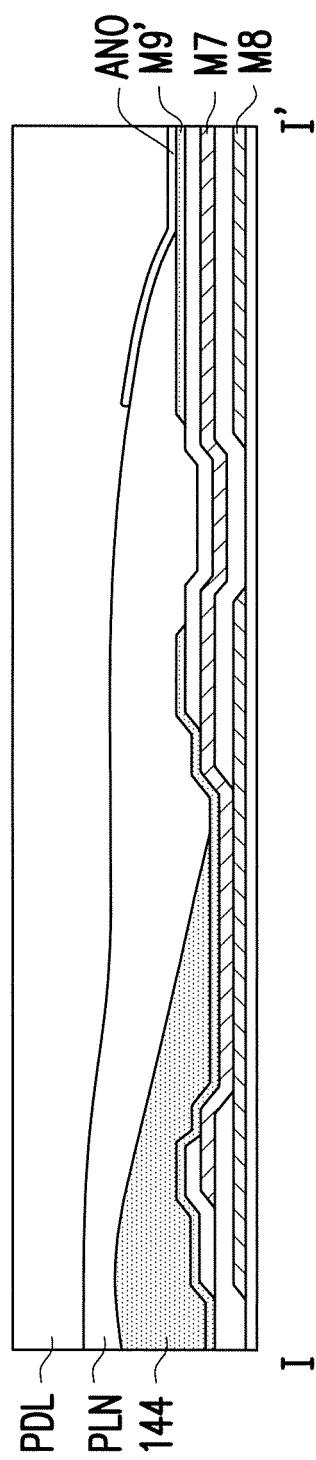

DISPLAY APPARATUS

CROSS-REFERENCE TO RELATED APPLICATION

This application claims the priority benefit of China application serial no. 201611107867.2, filed on Dec. 6, 2016. The entirety of the above-mentioned patent application is hereby incorporated by reference herein and made a part of this specification.

BACKGROUND OF THE INVENTION

1. Field of the Invention

The disclosure relates to a display apparatus, particularly relates to a display apparatus including a component shielding a channel region.

2. Description of Related Art

Normally, a driving transistor needs to be turned on for a long time, and the driving transistor needs to maintain a current passing through to ensure consistent brightness of light emitted from a light emitting region. However, when a photosensitive material, such as indium gallium zinc oxide (IGZO), is adopted as a channel layer, since the material may be excited by light easily, a photo leakage current or an offset initial voltage may occur. Consequently, the performance when the driving transistor is adopted may be affected significantly.

SUMMARY OF THE INVENTION

The disclosure provides a display apparatus having a device shielding a channel region.

A display apparatus according to an embodiment of the disclosure includes a substrate, a gate line, a first driving transistor, a second driving transistor, and a first color filter layer. The substrate has a first light emitting region, a second light emitting region, and a circuit region. The first light emitting region is disposed to be adjacent to the second light emitting region, and the circuit region is disposed to be adjacent to the first light emitting region and the second light emitting region. The gate line is disposed in the circuit region and extending along a first direction. The first driving transistor is disposed in the circuit region and corresponds to the first light emitting region. The first driving transistor has a first channel region. The second driving transistor is disposed in the circuit region and corresponds to the second light emitting region. The second driving transistor has a second channel region. The first color filter layer has a main portion and an extending portion. The main portion is connected to the extending portion and disposed in the first light emitting region, and the extending portion is disposed in the circuit region. The extending portion extends along a first direction and overlaps the first channel region and the second channel region.

A display apparatus according to an embodiment of the disclosure includes a substrate, a first driving transistor, a second driving transistor, a third driving transistor, a first color filter layer, a second color filter layer, a third color filter layer, and a light shielding pattern. The substrate has a first light emitting region, a second light emitting region, a third light emitting region, and a circuit region. The first light emitting region is located between the second light emitting region and the third light emitting region, and the circuit region is disposed to be adjacent to the first light emitting region, the second light emitting region, and the third light emitting region. The first driving transistor is disposed in the circuit region and corresponds to the first light emitting region. The first driving transistor has a first channel region. The second driving transistor is disposed in the circuit region and corresponds to the second light emitting region. The second driving transistor has a second channel region. The third driving transistor is disposed in the circuit region and corresponds to the third light emitting region. The third driving transistor has a third channel region. The first color filter layer is disposed in the first light emitting region. The second color filter layer is disposed in the second light emitting region. The third color filter layer is disposed in the third light emitting region. The light shielding pattern is disposed in the circuit region and overlaps the first channel region, the second channel region, and the third channel region. The light shielding pattern is disposed to be adjacent to the first color filter layer, the second color filter layer, and the third color filter layer. In addition, a color of the light shielding pattern is the same as a color of at least one of the first color filter layer, the second color filter layer, and the third color filter layer.

Based on the above, the display apparatus according to the embodiments of the disclosure includes the extending portion of the color filter layer or the light shielding pattern to shield the channel region of the driving transistor. Thus, the channel region may be prevented from being affected by light that may result in a light leakage current or an offset initial voltage of the driving transistor. Hence, the display apparatus according to the embodiments of the disclosure renders a desirable quality.

In order to make the aforementioned and other features and advantages of the disclosure comprehensible, several exemplary embodiments accompanied with figures are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

FIGS. 2C and 2D are respectively schematic cross-sectional views taken along a line I-I' and a line II-IP of FIG. 2B.

DESCRIPTION OF THE EMBODIMENTS

Figure 1A:
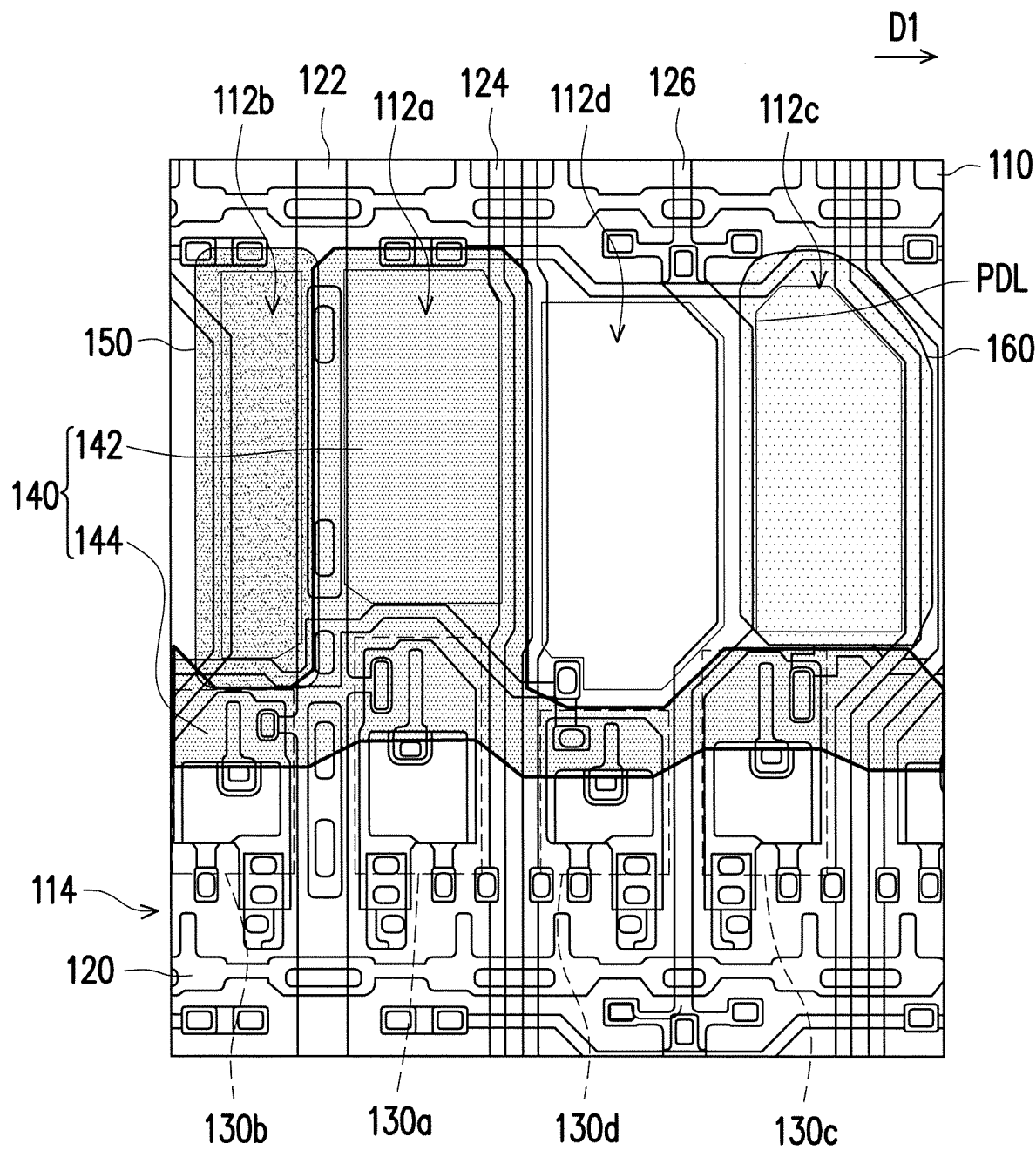
FIG. 1A is a schematic bottom view illustrating a display apparatus according to an embodiment of the disclosure.

Reference will now be made in detail to the present preferred embodiments of the disclosure, examples of which are illustrated in the accompanying drawings. Wherever possible, the same reference numbers are used in the drawings and the description to refer to the same or like parts.

The following disclosure provides many different embodiments or examples for implementing different features of the provided subject matter. Specific examples of components and arrangements are described below to simplify the disclosure. Nevertheless, these components and arrangements are merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Moreover, in the following descriptions, the first feature being electrically connected to the second feature includes embodiments in which the first feature is directly electrically connected to the second feature and embodiments in which the first feature is indirectly electrically connected to the second feature. In addition, the disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1B:
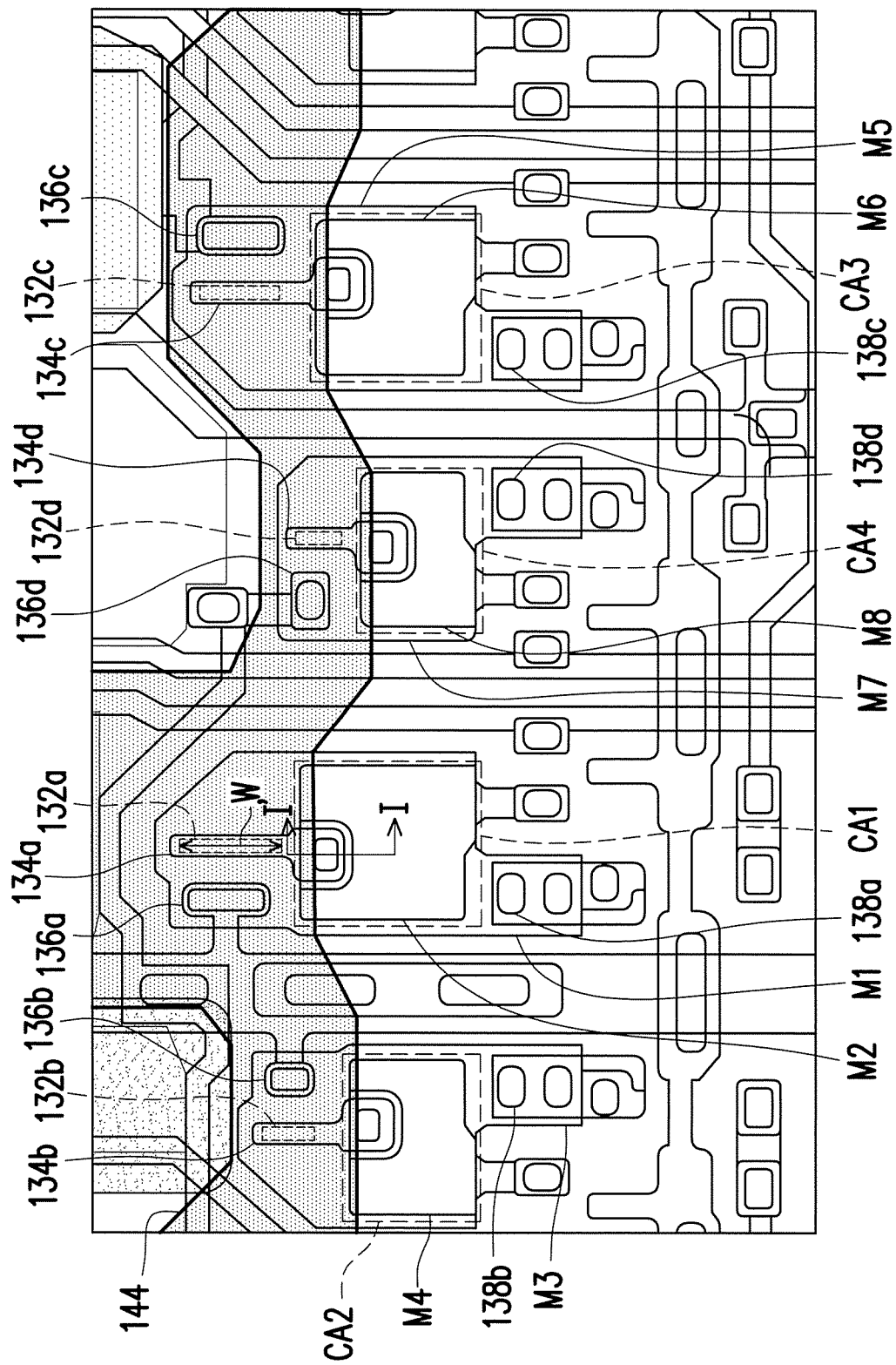
FIG. 1B is a schematic partial enlarged view of FIG. 1A.
Figure 1C:
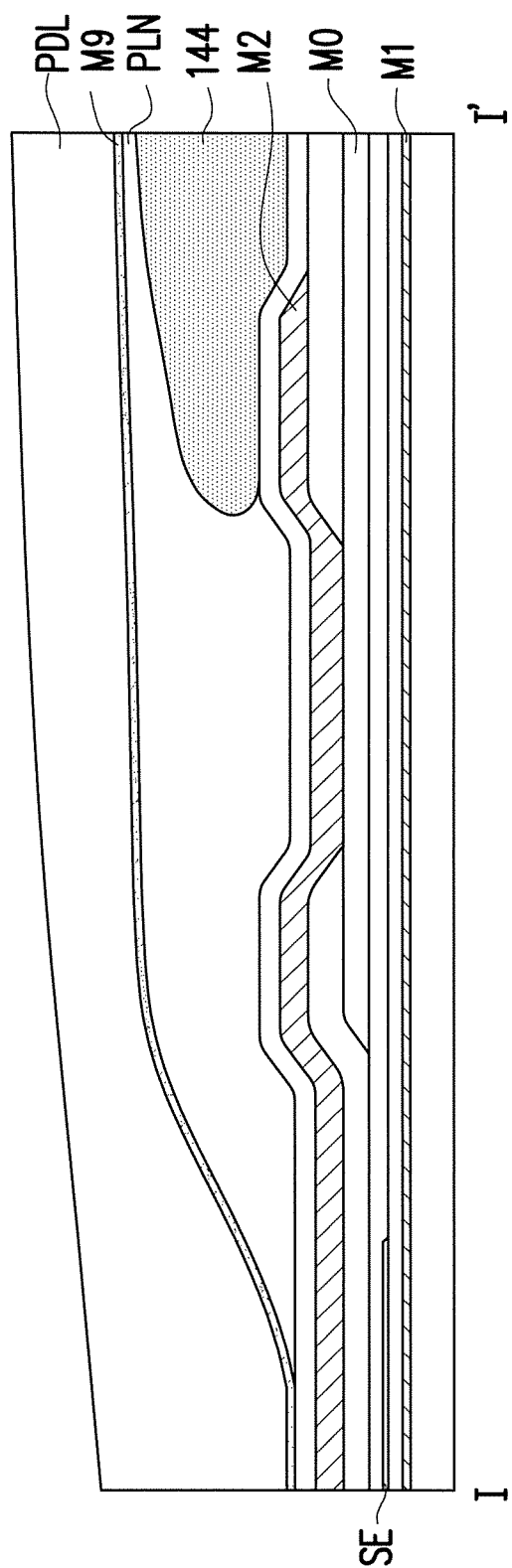
FIG. 1C is a schematic cross-sectional view taken along a line I-I' of FIG. 1B.

FIG. 1A is a schematic bottom view illustrating a display apparatus according to an embodiment of the disclosure, FIG. 1B is a schematic partial enlarged view of FIG. 1A, and FIG. 1C is a schematic cross-sectional view taken along a line I-I' of FIG. 1B. Referring to FIGS. 1A to 1C, in the embodiment, a display apparatus 100*a* my include a substrate 110, a gate line 120, a first driving transistor 130*a*, a second driving transistor 130*b*, a third driving transistor 130*c*, a first color filter layer 140, a second color filter layer 150, and a third color filter layer 160. The substrate 110 may include a first light emitting region 112*a*, a second light emitting region 112*b*, a third light emitting region 112*c*, and a circuit region 114. The first light emitting region 112*a* may be disposed to be adjacent to the second light emitting region 112*b*. In the embodiment, the first light emitting region 112*a* is located between the second light emitting region 112*b* and the third light emitting region 112*c*, for example. However, the disclosure is not limited thereto. In the embodiment, the "light emitting region" is defined as a region defined by a pixel define layer (PDL) excluding a region shielded by a light shielding component such as metal. The circuit region 114 may be disposed to be adjacent to the first light emitting region 112*a*, the second light emitting region 112*b*, and the third light emitting region 112*c*. Specifically, if the first light emitting region 112*a*, the second light emitting region 112*b*, and the third light emitting region 112*c* of FIG. 1A are considered as a row of light emitting regions, the circuit region 114 is located between two adjacent rows of light emitting regions. However, the disclosure is not limited thereto. Moreover, in the embodiment, the substrate 110 further includes a fourth light emitting region 112*d*, for example. The fourth light emitting region 112*d* may be disposed to be adjacent to the first light emitting region 112*a* and between the first light emitting region 112*a* and the third light emitting region 112*c*. However, the disclosure is not limited thereto. In other words, the disclosure does not intend to limit the number of light emitting regions, as long as the first light emitting region 112*a* and the second light emitting region 112*b* are included. Normally, the display apparatus 100*a* may include light emitting regions (not shown) arranged into a plurality of sets. In addition, a region between two rows of the light emitting regions may be a circuit region. However, the disclosure is not limited thereto.

In the embodiment, the gate line 120 may be disposed in the circuit region 114, and the gate line 120 may extend along a first direction D1. In the embodiment, the display apparatus 110*a* further includes a power line 122, a data line 124, and a reference line 126 respectively intersecting the gate line 120. However, the disclosure is not limited thereto. In the embodiment, the gate line 120 is designed to have variable widths, for example. However, the disclosure is not limited thereto. In other words, in other embodiments, the gate line 120 may have a uniform width and extend as a straight line, and the gate line 120 may exhibit other designs. The disclosure does not intend to impose a limitation on these regards.

The first driving transistor 130*a* may be disposed in the circuit region 114. The first driving transistor 130*a* may have a first channel region 132*a*, and the first driving transistor 130*a* may correspond to the first light emitting region 112*a*. A semiconductor material of the first channel region 132*a* is photosensitive, for example, such as indium gallium zinc oxide (IGZO), amorphous silicon (a-Si), low temperature poly-silicon (LTPS), or other semiconductor materials. However, the disclosure is not limited thereto. In the embodiment, the first driving transistor 130*a* further includes a gate 134*a*, a source 136*a*, and a drain 138*a*. The first channel region 132*a* is located below the gate 134*a* and partially overlapped with the gate 134*a*, for example. The gate 134*a* is indirectly electrically connected with the gate line 120, for example. In other words, the gate line 120 may transmit a signal to the gate 134*a* via another component, for example, and the source 136*a* is electrically connected to the power line 122, for example. In the embodiment, the first driving transistor 130*a* is a top-gate driving transistor, for example. However, the disclosure is not limited thereto. Similarly, the second driving transistor 130*b* may be disposed in the circuit region 114. The second driving transistor 130*b* may have a second channel region 132*b*, a gate 134*b*, a source 136*b*, and a drain 138*b*. Moreover, the second driving transistor 130*b* may correspond to the second light emitting region 112*b*. A semiconductor material of the second channel region 132*b* includes a photosensitive material, for example, such as indium gallium zinc oxide (IGZO), amorphous silicon (a-Si), low temperature poly-silicon (LTPS), or other semiconductor materials. However, the disclosure is not limited thereto. Components of the second driving transistor 130*b* are similar to those of the first driving transistor 130*a*, and thus are not repeated in the following. Similarly, the third driving transistor 130*c* may be disposed in the circuit region 114. The third driving transistor 130*c* may have a third channel region 132*c*, a gate 134*c*, a source 136*c*, and a drain 138*c*. Moreover, the third driving transistor 130*c* may correspond to the third light emitting region 112*c*. A semiconductor material of the third channel region 132*c* includes a photosensitive material, for example, such as indium gallium zinc oxide (IGZO), amorphous silicon (a-Si), low temperature poly-silicon (LTPS), or other semiconductor materials. However, the disclosure is not limited thereto. Components of the third driving transistor 130c are similar to those of the first driving transistor 130a, and thus are not repeated in the following. In addition, the display apparatus 100a may further include a fourth driving transistor 130d corresponding to the fourth light emitting region 112d, for example. The fourth driving transistor 130d may include a fourth channel region 132d, a gate 134d, a source 136d, and a drain 138d. In addition, the fourth driving transistor 130d may correspond to the fourth light emitting region 112d. A semiconductor material of the fourth channel region 132d includes a photosensitive material, for example, such as indium gallium zinc oxide (IGZO), amorphous silicon (a-Si), low temperature poly-silicon (LTPS), or other semiconductor materials. However, the disclosure is not limited thereto. Components of the fourth driving transistor 130d are similar to those of the first driving transistor 130a, and thus are not repeated in the following.

Figure 2A:
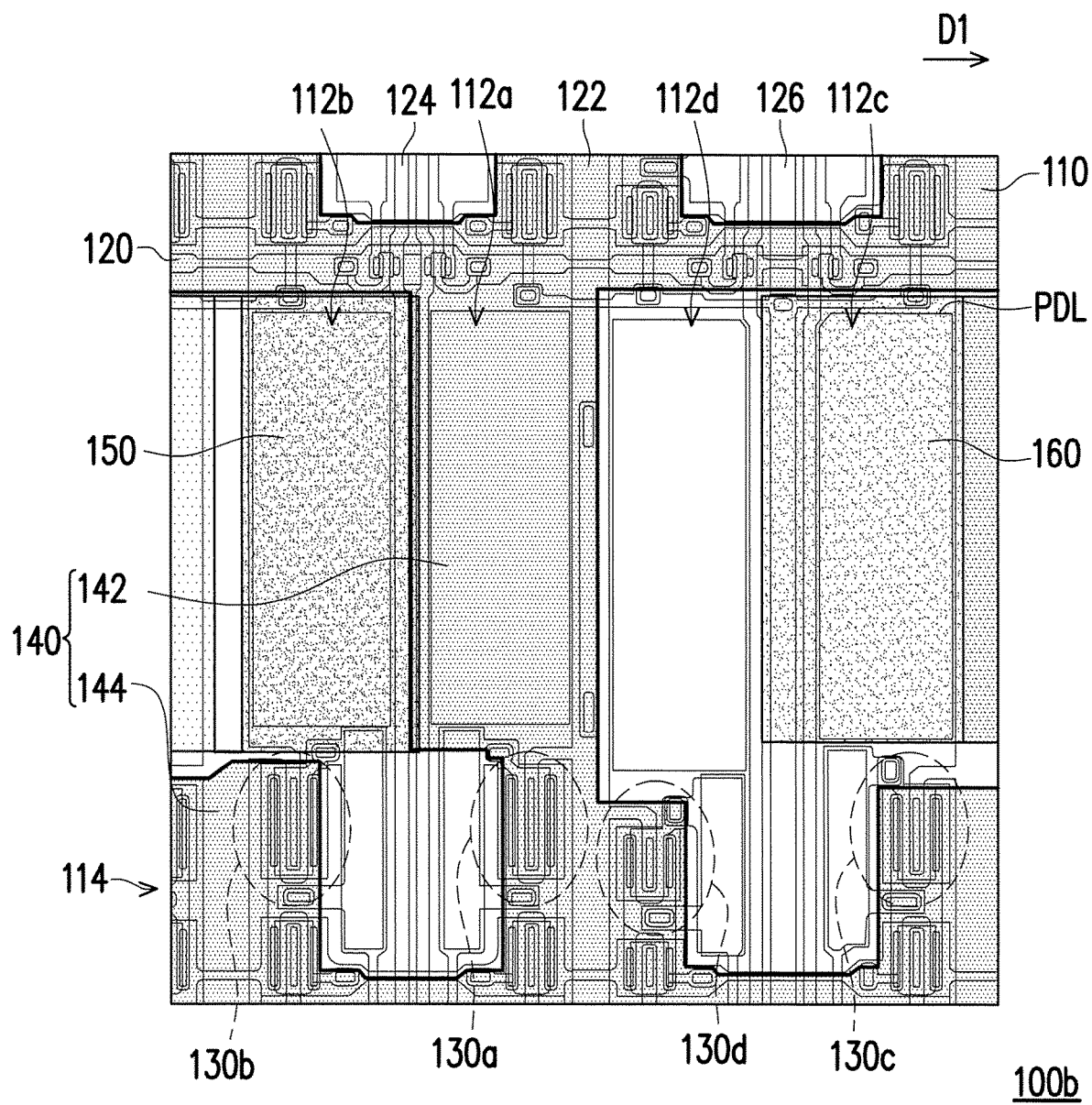
FIG. 2A is a schematic bottom view illustrating a display apparatus according to an embodiment of the disclosure.
Figure 2B:
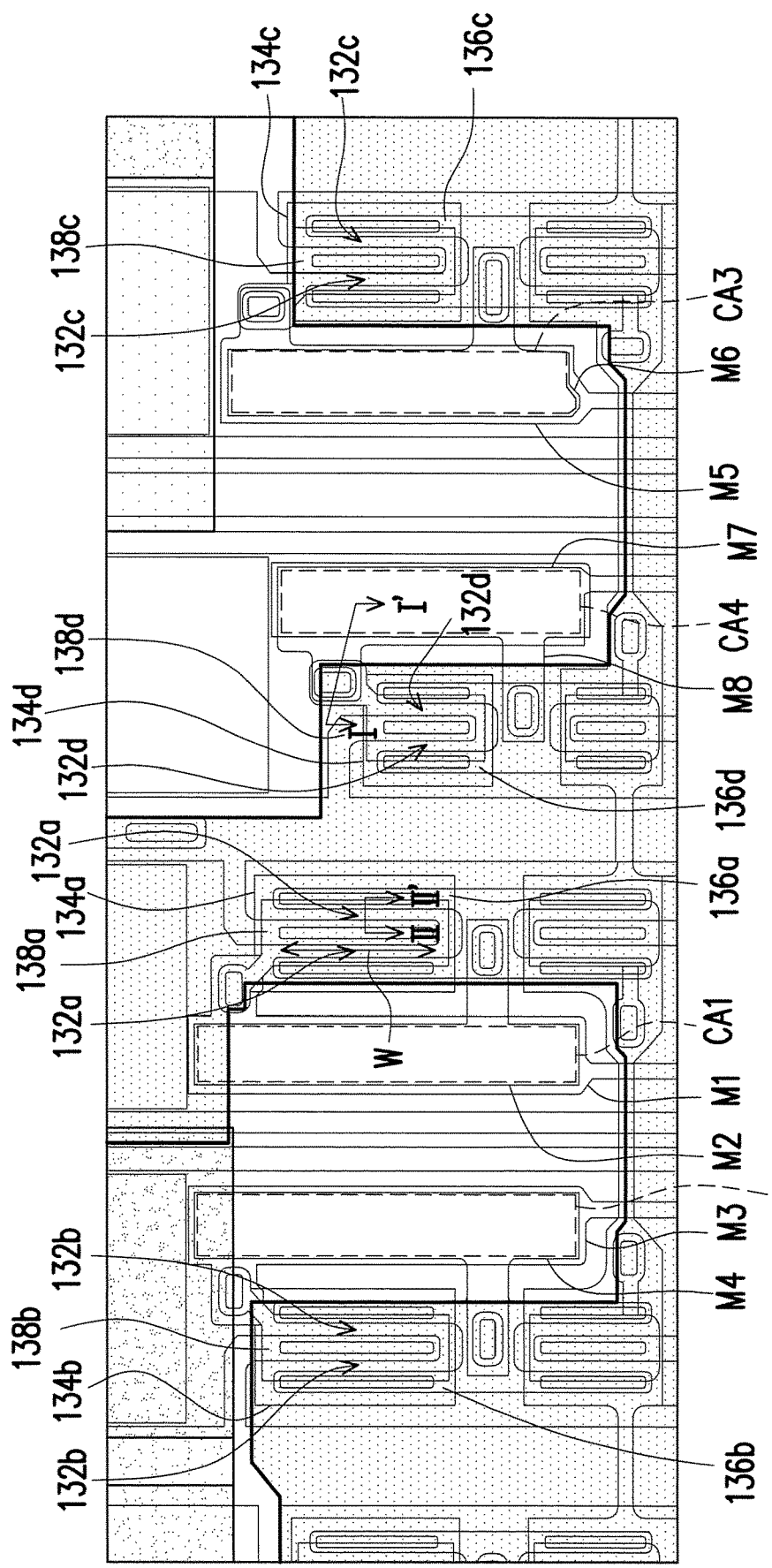
FIG. 2B is a schematic partial enlarged view of FIG. 2A.
Figure 2D:
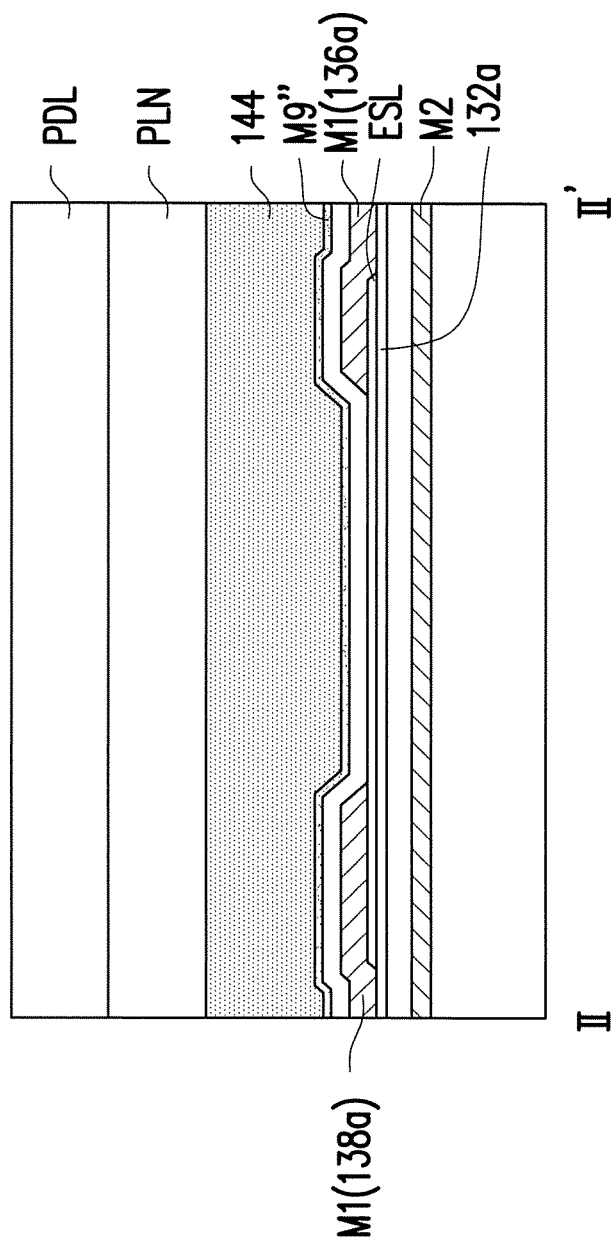

Moreover, even though the embodiment is described with an example that the first driving transistor 130a, the second driving transistor 130b, the third driving transistor 130c, and the fourth driving transistor 130d have the design shown in FIG. 1A, the disclosure is not limited thereto. In other words, in other embodiments, the first driving transistor 130a, the second driving transistor 130b, the third driving transistor 130c, and the fourth driving transistor 130d may exhibit other designs, such as a design shown in FIGS. 2A to 2D. FIG. 2A is a schematic bottom view illustrating a display apparatus according to an embodiment of the disclosure, FIG. 2B is a schematic partial enlarged view of FIG. 2A, and FIGS. 2C and 2D are respectively schematic cross-sectional views taken along a line I-I' and a line II-II' of FIG. 2B. Similarities between a display apparatus 100b shown in FIG. 2A and the display apparatus 100a shown in FIG. 1A will not be repeated in the following. The difference lies in that, as shown in FIG. 2D, the first driving transistor 130a of the display apparatus 100b is a bottom-gate driving transistor or a double-gate driving transistor, for example, or the first driving transistor 130a may further include an etch stop layer ESL, for example. However, the disclosure is not limited thereto. In the embodiment, as shown in FIG. 2B, the first driving transistor 130a includes two channel regions 132a, for example. However, the disclosure is not limited thereto. A stack structure in the display apparatus 100a of the embodiment may be as shown in FIG. 1C. For example, the first driving transistor 130a further includes a conductive layer M0, a semiconductor layer SE, a first conductive layer M1, a second conductive layer M2, a planar layer PLN, an extending portion 144, a pixel define layer PDL, and a ninth semiconductor layer M9. The first semiconductor layer M1 is located between the substrate 110 and the conductive layer M0, for example. The second conductive layer M2 is located above the conductive layer M0, for example. The semiconductor layer SE is located between the first conductive layer M1 and the second conductive layer M2, for example. The planar layer PLN is located between the ninth conductive layer M9 and the second conductive layer M2, for example, and the ninth conductive layer M9 is located above the planar layer PLN. The extending portion 144 is located between the ninth conductive layer M9 and the second conductive layer M2, for example. The planar layer PLN may be partially located above the extending portion 144, for example. In addition, the pixel define layer PDL is located above the ninth conductive layer M9, for example. However, the disclosure is not limited thereto. In the embodiment, the ninth conductive layer M9 may be an anode, for example, and may be formed by a transparent conductive layer, for example. In the embodiment, an insulating layer may be further disposed between any adjacent two layers of the semiconductor layer SE, the conductive layer M0, the first conductive layer M1, the second conductive layer M2, and the ninth conductive layer M9. However, the disclosure is not limited thereto. The extending portion 144, the semiconductor layer SE, the second conductive layer M2, and the ninth conductive layer M9 will be described in detail in subsequent paragraphs. Therefore, detailed descriptions thereof will be omitted for now. As an example, in the embodiment shown in FIG. 2C, the fourth driving transistor 130d includes a seventh conductive layer M7, an eighth conductive layer M8, a ninth conductive layer M9', the planar layer PLN, the pixel define layer PDL, the extending portion 144, and an anode layer ANO. In addition, the eighth conductive layer M8 is located above the substrate, for example, the seventh conductive layer M7 is located above the eighth conductive layer M8 and between the eighth conductive layer M8 and the ninth conductive layer M9', for example, the extending portion 144 is located above the ninth conductive layer M9', for example, the planar layer PLN is located above the extending portion 144 and the ninth conductive layer M9', for example, the anode layer ANO is located above the ninth conductive layer M9' and the planar layer PLN, for example, and the pixel define layer PDL is located above the anode layer ANO and the planar layer PLN, for example. However, the disclosure is not limited thereto. In the embodiment, an insulating layer may be further disposed between any adjacent two layers of the seventh conductive layer M7, the eighth conductive layer M8, and the ninth conductive layer M9'. However, the disclosure is not limited thereto. Moreover, FIG. 2D specifically indicates relative positions of the source 136a, the first channel region 132a, and the drain 138a. A length of the first channel region 132a is close to a length of the etch stop layer ECL, for example. In other words, an edge of the first channel region 132a is near an edge of the etch stop layer ESL, for example. In the embodiment, the first driving transistor 130a may further include a ninth conductive layer M9". The ninth conductive layer M9" is located above the first conductive layer M1, for example, and may be formed by a transparent conductive layer, for example. However, the disclosure is not limited thereto.

In FIGS. 1A and 2A, the first color filter layer 140 may include a main portion 142 and the extending portion 144. The main portion 142 and the extending portion 144 are connected to each other. The main portion 142 may be disposed in the first light emitting region 112a, and the extending portion 144 may be disposed in the circuit region 114. The extending portion 144 may extend along the first direction D1, and may be overlapped with the first channel region 132a and the second channel region 132b. In the embodiment, the extending portion 144 is further overlapped with the third channel region 132c and the fourth channel region 132d, for example. In other words, the extending portion 144 shields the first channel region 132a to the fourth channel region 132d to prevent light from irradiating the first channel region 132a to the fourth channel region 132d. Therefore, the extending portion 144 may also be referred to as a light shielding pattern. The first color filter layer 140 may be disposed in the first light emitting region 112a, the second color filter layer 150 may be disposed in the second light emitting region 112b, and the third color filter 160 may be disposed in the third light emitting region 112c. In the embodiment, an area of the color filter layer is equal to or greater than an area of the light emitting region, for example. Moreover, adjacent color filters are overlapped at where the color filters are connected to each other, for example. However, the disclosure is not limited thereto.

In the embodiment, if the extending portion 144 is considered as a component independent from the main portion 142, the main portion 142 may be referred to as the first color filter layer, and the extending portion 144 may be referred to as the light shielding pattern. As shown in FIGS. 1A and 2A, the light shielding pattern (i.e., the extending portion 144) may be disposed in the circuit region 114 to shield the first channel region 132a, the second channel region 132b, and the third region 132c. The light shielding pattern (i.e., the extending portion 144) may be disposed to be adjacent to the first color filter layer (i.e., the main portion 142), the second color filter layer 150, and the third color filter layer 160. In addition, a color of the light shielding pattern (i.e., the extending portion 144) may be the same as a color of at least one of the first color filter layer (i.e., the main portion 142), the second color filter layer 150, and the third color filter layer 160. In the embodiment, the color of the light shielding pattern (i.e., the extending portion 144) is the same as the color of the first color filter layer (i.e., the main portion 142), for example, and the light shielding pattern (i.e., the extending portion 144) is integrally formed with the first color filter layer (i.e., the main portion 142), for example. Therefore, the color of the light shielding pattern (i.e., the extending portion 144) is different from the colors of the second color filter layer 150 and the third color filter layer 160. Of course, in other embodiments (not shown), the light shielding pattern may also extend from the second color filter layer 150, so the color of the light shielding pattern may be different from the colors of the first color filter layer 140 and the third color filter layer 160. Alternatively, in other embodiments (not shown), the light shielding pattern may also extend from the third color filter layer 160, so the color of the light shielding pattern may be different from the colors of the first color filter layer 140 and the second color filter layer 150. In the embodiment, since the light shielding pattern and the color filter layer are manufactured together, no additional manufacturing process is required, or a significant increase in manufacturing cost or time is prevented.

Moreover, even though the embodiments in FIGS. 1A and 2A include four light emitting regions, the display apparatus may actually include a plurality of light emitting regions arranged into a plurality of sets. Therefore, the main portion 142 and the extending portion 144 together substantially form a pattern having openings. In addition, the openings may expose the light emitting regions (e.g., the second to fourth light emitting regions) except for the first light emitting region 112a and the circuit region 114 except for the extending portion 144. However, it should be noted that the disclosure is not limited thereto. In an embodiment, as shown in FIG. 2A, the main portion 142 and the extending portion 144 may also form a mesh pattern having openings, for example, where a lower portion of the main portion 142 and an upper portion of the extending portion 144 are connected. The openings may expose the light emitting regions (e.g., the second to fourth light emitting regions) except for the first light emitting region 112a and the circuit region 114 except for the extending portion 144. Nevertheless, the disclosure is not limited thereto. In the embodiment, since the light shielding pattern and the color filter layer are manufactured together, no additional manufacturing process is required, or a significant increase in manufacturing cost or time is prevented.

In the embodiment, the display apparatus 100a includes the first conductive layer M1 and the second conductive layer M2 disposed corresponding to the first driving transistor 130a, for example. In addition, the first conductive layer M1 and the second conductive layer M2 are at least partially overlapped, and a region where the first conductive layer M1 and the second conductive layer M2 are overlapped is referred to as a first overlapped region CA1. Moreover, the first overlapped region CA1 may form a first storage capacitor. Similarly, the display apparatus 100a includes a third conductive layer M3 and a fourth conductive layer M4 disposed corresponding to the second driving transistor 130b. In addition, the third conductive layer M3 and the fourth conductive layer M4 are at least partially overlapped, and a region where the third conductive layer M3 and the fourth conductive layer M4 are overlapped is referred to as a second overlapped region CA2. Moreover, the second overlapped region CA2 may form a second storage capacitor. In the same light, the display apparatus 100a includes a fifth conductive layer M5 and a sixth conductive layer M6 disposed corresponding to the third driving transistor 130c. In addition, the fifth conductive layer M5 and the sixth conductive layer M6 are at least partially overlapped, and a region where the fifth conductive layer M5 and the sixth conductive layer M6 are overlapped is referred to as a third overlapped region CA3. Moreover, the third overlapped region CA3 may form a third storage capacitor. Furthermore, the display apparatus 100a includes the seventh conductive layer M7 and the eighth conductive layer M8 disposed corresponding to the fourth driving transistor 130d. In addition, the seventh conductive layer M7 and the eighth conductive layer M8 are at least partially overlapped, and a region where the seventh conductive layer M7 and the eighth conductive layer M8 are overlapped is referred to as a fourth overlapped region CA4. Moreover, the fourth overlapped region CA4 may form a fourth storage capacitor. In the embodiment, referring to FIG. 1C and taking the first driving transistor 130a as an example, the display apparatus 100a may further include the ninth conductive layer M9 disposed corresponding to the first driving transistor 130a. In addition, a capacitance of the storage capacitor may be obtained by calculating a capacitance of a capacitor formed by a region where the semiconductor layer SE and the second conductive layer M2 are overlapped and a capacitance of a capacitor formed by a region where the second conductive layer M2 and the ninth conductive layer M9 are overlapped in serial connection. Referring to FIG. 2C and taking the fourth driving transistor 130d as an example, the display apparatus 100a may further include the ninth conductive layer M9' disposed corresponding to the fourth driving transistor 130d. In addition, a capacitance of the storage capacitor may be obtained by calculating a capacitance of a capacitor formed by a region where the seventh conductive layer M7 and the eighth conductive layer M8 are overlapped and a capacitance of a capacitor formed by a region where the seventh conductive layer M7 and the ninth conductive layer M9' are overlapped in serial connection. In the embodiment of FIG. 1C, the second conductive layer M2 is located between the first conductive layer M1 and the ninth conductive layer M9, for example. However, the disclosure does not intend to limit how the first conductive layer M1, the second conductive layer M2, and the ninth conductive layer M9 are arranged with respect to each other. In the embodiment, the first conductive layer M1 and the second conductive layer M2 are patterned conductive layers formed on the substrate 110, for example, and the ninth conductive layer M9 is a complete layer of transparent conductive layer formed on the substrate 110, for example. However, the disclosure is not limited thereto. In the embodiment, the first conductive layer M1 to the ninth conductive layers M9, M9' and M9" may be electrodes or semiconductor layers, and materials of the first conductive layer M1 to the ninth conductive layers M9, M9' and M9" may include metal, a transparent metal oxide such as indium tin oxide, or a semiconductor material such as indium gallium zinc oxide. However, the disclosure is not limited thereto. Materials and arrangements of the ninth conductive layer M9" and the ninth conductive layer M9' are similar to those of the ninth conductive layer M9, and thus will not be repeated in the following. In the embodiment, at least two of the first conductive layer M1, the third conductive layer M3, the fifth conductive layer M5 and the seventh conductive layer M7 may be at the same or all of them may be at different layers. It should be noted that the disclosure does not intend to impose a limitation on this regard. Similarly, at least two of the second conductive layer M2, the fourth conductive layer M4, the sixth conductive layer M6, and the eighth conductive layer M8 may be at the same or all of them may be at different layers. It should be noted that the disclosure does not intend to impose a limitation on this regard. Moreover, at least two of the ninth conductive layer M9, the ninth conductive layer M9' and the ninth conductive layer M9" may be at the same or all of them may be at different layers. It should be noted that the disclosure does not intend to impose a limitation on this regard.

In the embodiment, as shown in FIG. 1C, the second conductive layer M2 may be located between the first conductive layer M1 and the ninth conductive layer M9, and the extending portion 144 may be disposed between the second conductive layer M2 and the ninth conductive layer M9. When the extending portion 144 is not overlapped with the first overlapped region CA1, a distance between the second conductive layer M2 and the ninth conductive layer M9 is shorter, and the capacitance formed accordingly is greater. However, as shown in FIG. 1C, when the extending portion 144 is partially overlapped with the first overlapped region CA1, the distance between the second conductive layer M2 becomes greater, and the capacitance formed accordingly becomes smaller. If a portion where the extending portion 144 and the first overlapped region CA1 are overlapped is increased, the capacitance formed accordingly is more likely to be insufficient to maintain a voltage difference of the driving transistor.

Figures 3A, 3B:
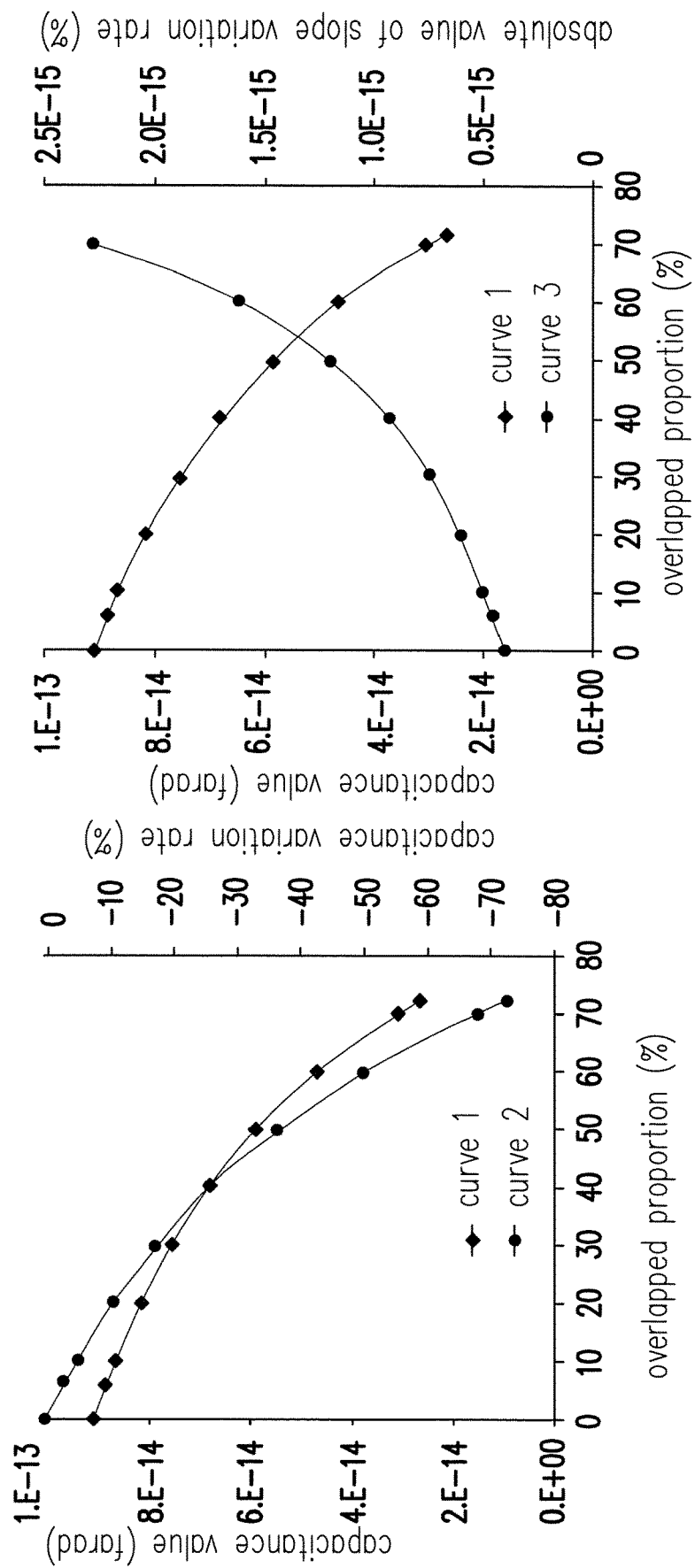
FIGS. 3A and 3B are diagrams illustrating a relation curve (curve 1) between an overlapped ratio between an extending portion and an overlapped region and a capacitance value, a relation curve (curve 2) between the overlapped ratio and a capacitance variation rate, and a relation curve (curve 3) between the overlapped ratio and an absolute value of a slope variation rate.

FIG. 3A is a diagram illustrating a relation curve (curve 1) between an overlapped proportion (overlapped ratio) between the extending portion and the overlapped region and a capacitance value (the unit thereof is farad) and a relation curve (curve 2) between the overlapped proportion and a capacitance variation rate. FIG. 3B is a diagram illustrating the relation curve (curve 1) between the overlapped proportion between the extending portion and the overlapped region and the capacitance value and a relation curve between the overlapped proportion and an absolute value of a slope variation rate of curve 1. The overlapped proportion between the extending portion and the overlapped region refers to a proportion of an area where the extending portion and the overlapped region are overlapped in a total area of the overlapped region. In other words, the overlapped proportion between the extending portion and the overlapped region is a proportion obtained by dividing the area where the extending portion and the overlapped region are overlapped by the total area of the overlapped region. As shown in FIGS. 3A and 3B, the capacitance variation rate becomes more significant when the overlapped proportion exceeds 40%. In other words, when the overlapped proportion exceeds 40%, an extent to which the capacitance value decreases is increased, rendering the storage capacitor less likely to maintain the voltage difference of the driving transistor. Therefore, in the embodiment, an overlapped proportion between the extending portion 144 and the first overlapped region CA1 is greater than or equal to 0% and is less than or equal to 40%, for example. In an embodiment, the capacitance variation rate in a conventional manufacturing process is controlled at about 10%, for example. Thus, as shown in FIG. 3A, when the capacitance variation rate is about 10%, the overlapped proportion between the extending portion 144 and the first overlapped region CA1 is greater than or equal to 0% and less than or equal to 20%, for example. In another embodiment, the overlapped proportion between the extending portion 144 and the first overlapped region CA1 is greater than or equal to 0% and is less than or equal to 10%, for example.

Besides, human eyes are more sensitive to green light than to blue light or red light. Therefore, an optical arrangement on the red, green, and blue colors is made, so that an area of a green light emitting region is smaller than an area of a blue light emitting region or an area of a red light emitting region in order to meet suitable optical specifications. Compared with the blue light emitting region or the red light emitting region, the smaller area of the green light emitting region may be arranged with a smaller driving current or a smaller storage capacitor. Therefore, a channel width of the driving transistor of the green light emitting region may be more narrowed, or an area of the storage capacitor of the green light emitting region may be smaller.

In the embodiment, the first color filter layer 140 is a red color filter layer, for example, the second color filter layer 150 is one of a green color filter layer and a blue color filter layer, for example, and the third color filter layer 160 may be the other of the blue color filter layer and the green color filter layer, for example. However, the disclosure is not limited thereto. Moreover, in the embodiment, WRGB is adopted as an example. Therefore, the fourth light emitting region 112d is not covered by a color filter layer, for example, so as to emit white light. Nevertheless, the disclosure is not limited thereto. In FIG. 1A, the first color filter layer 140 may be a red color filter layer, the second color filter layer 150 may be a green color filter layer, and the third color filter layer 160 may be a blue color filter layer. In addition, an area A1 of the first light emitting region 112a may be greater than or equal to an area A2 of the second light emitting region 112b, for example, or an area A3 of the third light emitting region 112c is greater than or equal to the area A2 of the second light emitting region 112b, for example. However, the disclosure is not limited thereto. In the embodiment, the area A1 of the first light emitting region 112a is greater than or equal to the area A2 of the second light emitting region 112b and is smaller than or equal to three times of the area A2 of the second light emitting region 112b, for example, or the area A3 of the third light emitting region 112c is greater than or equal to the area A2 of the second light emitting region 112b and is smaller than or equal to three times of the area A2 of the second light emitting region 112b, for example. However, the disclosure is not limited thereto. In FIG. 2A, the first color filter layer 140 may be a red color filter layer, the second color filter layer 150 may be a blue color filter layer, and the third color filter layer 160 may be a green color filter layer. In addition, the area A1 of the first light emitting region 112a may be greater than or equal to the area A3 of the third light emitting region 112c, for example, or the area A2 of the second light emitting region 112b is greater than or equal to the area A3 of the third light emitting region 112c, for example. However, the disclosure is not limited thereto. In the embodiment, the area A1 of the first light emitting region 112a is greater than or equal to the area A3 of the third light emitting region 112c and is smaller than or equal to two times of the area A3 of the third light emitting region 112c, for example, or the area A2 of the second light emitting region 112b is greater than or equal to the area A3 of the third light emitting region 112c and is smaller than or equal to two times of the area A3 of the third light emitting region 112c, for example. However, the disclosure is not limited thereto.

In the embodiment shown in FIG. 1A, the area A1 of the first light emitting region 112a is greater than or equal to 1.6 times of the area A2 of the second light emitting region 112b and smaller than or equal to 2.2 times of the area A2 of the second light emitting region 112b, for example. The area A3 of the third light emitting region 112c is greater than or equal to 1.4 times of the area A2 of the second light emitting region 112b and smaller than or equal to 2 times of the area A2 of the second light emitting region 112b, for example. The area A1 of the first light emitting region 112a is 11410 $\mu m^2$, for example, the area A2 of the second light emitting region 112b is 6025 $\mu m^2$, for example, or the area A3 of the third light emitting region 112c is 10315 $\mu m^2$, for example. In the embodiment shown in FIG. 2A, the area A1 of the first light emitting region 112a is greater than or equal to 1 time of the area A3 of the third light emitting region 112c and smaller than or equal to 1.3 times of the area A3 of the third light emitting region 112c, for example. The area A2 of the second light emitting region 112b is greater than or equal to 1 time of the area A3 of the third light emitting region 112c and smaller than or equal to 1.3 times of the area A3 of the third light emitting region 112c, for example. The area A1 of the first light emitting region 112a is 39521 $\mu m^2$, for example, the area A2 of the second light emitting region 112b is 41004 $\mu m^2$, for example, or the area A3 of the third light emitting region 112c is 38374 $\mu m^2$, for example.

In the embodiment shown in FIG. 1A, the first color filter layer 140 is a red color filter layer, the second color filter layer 150 is a green color filter layer, and the third color filter layer 160 is a blue color filter layer. In the embodiment, a width W of the first channel region 132a is greater than or equal to a width W of the second channel region 132b, for example, or a width W of the third channel region 132c is greater than or equal to the width W of the second channel region 132b, for example. However, the disclosure is not limited thereto. The width W of the first channel region 132a is greater than or equal to 1.5 times of the width W of the second channel region 132b, and is less than or equal to 2.1 times of the width W of the second channel region 132b. The width W of the third channel region 132c is greater than or equal to 1.5 times of the width W of the second channel region 132b, and is less than or equal to 2.1 times of the width W of the second channel region 132b. The width W of the first channel region 132a is 29.7 $\mu m$, for example, the width W of the second channel region 132b is 16.4 $\mu m$, for example, or the width W of the third channel region 132c is 29.2 $\mu m$, for example. In the embodiment shown in FIG. 2A, the first color filter layer 140 is a red color filter layer, the second color filter layer 150 is a blue color filter layer, and the third color filter layer 160 is a green color filter layer. In the embodiment, the width W of the first channel region 132a is greater than or equal to the width W of the third channel region 132c, for example, or the width W of the second channel region 132b is greater than or equal to the width W of the third channel region 132c, for example. However, the disclosure is not limited thereto. The width W of the first channel region 132a is greater than or equal to 1 times of the width W of the second channel region 132b, and is less than or equal to 1.4 times of the width W of the second channel region 132b. The width W of the third channel region 132c is greater than or equal to 1 times of the width W of the second channel region 132b, and is less than or equal to 1.4 times of the width W of the second channel region 132b. The width W of the first channel region 132a is 28.3 $\mu m$, for example, the width W of the second channel region 132b is 29.1 $\mu m$, for example, or the width W of the third channel region 132c is 24.6 $\mu m$, for example.

In the embodiment shown in FIG. 1A, the first color filter layer 140 is a red color filter layer, the second color filter layer 150 is a green color filter layer, and the third color filter layer 160 is a blue color filter layer. The first overlapped region CA1 is greater than or equal to the second overlapped region CA2, for example, or the third overlapped region CA3 is greater than or equal to the second overlapped region CA2, for example. However, the disclosure is not limited thereto.

In the embodiment shown in FIG. 1A, the first overlapped region CA1 is greater than or equal to 1 time of the second overlapped region CA2, and is smaller than or equal to 1.7 times of the second overlapped region CA2, for example. The third overlapped region CA3 is greater than or equal to 1 time of the second overlapped region CA2, and is smaller than or equal to 1.5 times of the second overlapped region CA2. The first overlapped region CA1 is 2643 $\mu m^2$, for example, the second overlapped region CA2 is 1928 $\mu m^2$, for example, and the third overlapped region CA3 is 2386 $\mu m^2$, for example. In the embodiment shown in FIG. 2A, the first overlapped region CA1 is greater than or equal to 1 time of the third overlapped region CA3, and is smaller than or equal to 1.5 times of the third overlapped region CA3, for example. The second overlapped region CA2 is greater than or equal to 1 time of the third overlapped region CA3, and is smaller than or equal to 1.5 times of the third overlapped region CA3. The first overlapped region CA1 is 6697 $\mu m^2$, for example, the second overlapped region CA2 is 7119 $\mu m^2$, for example, and the third overlapped region CA3 is 5821 $\mu m^2$, for example.

Figure 4:
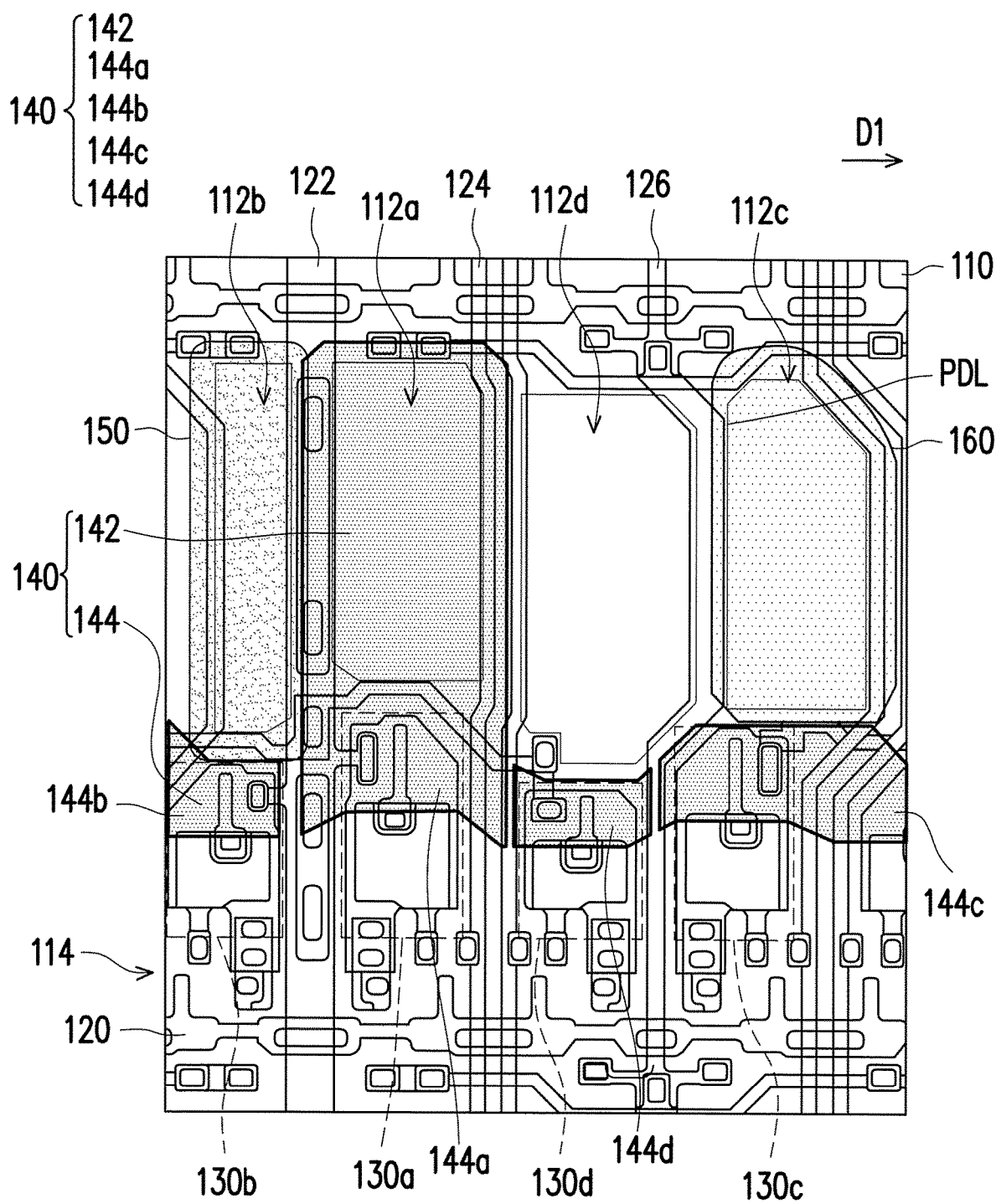
FIG. 4 is a schematic bottom view illustrating a display apparatus according to an embodiment of the disclosure.

In the above embodiments, the extending portion 144 is described as continuously extending in the circuit region 114, for example. However, the disclosure is not limited thereto. For example, as shown in FIG. 4, the extending portion 144 in a display apparatus 100c may include a plurality of island-like patterns 144a, 144b, and 144c separated from each other. The island-like patterns 144a, 144b, and 144c are respectively located in the circuit region 114 and adjacent to the first light emitting region 112a, the second light emitting region 112b, and the third light emitting region 112c. The island-like pattern 144a is disposed to be adjacent to the first color filter layer (i.e., the main portion 142), the island-like pattern 144b is disposed to be adjacent to the second color filter layer 150, and the island-like pattern 144c is disposed to be adjacent to the third color filter layer 160. In the embodiment, the extending portion 144 further includes an island-like pattern 144d, for example, located in the circuit region 114 and adjacent to the fourth light emitting region 112d. Moreover, in the embodiment, the island-like pattern 144a is physically connected to the first color filter layer (i.e., the main portion 142), for example, but the disclosure is not limited thereto. In other embodiments, the island-like pattern 144a may also have the same color as that of the first color filter layer (i.e., the main portion 142), but not integrated with the first color filter layer (i.e., the main portion 142) (not shown). In other embodiments, the island-like patterns 144a, 144b, 144c, and 144d may have other shapes. The disclosure does not intend to impose a limitation on this regard.

In the embodiments, the display apparatus 100a, the display apparatus 100b, or the display apparatus 100c may be implemented as an organic light emitting diode (OLED) display, a micro OLED display, a quantum dot (QD) display, a flexible display, a touch display, a curved display, or other types of displays. It should be noted that the disclosure does not intend to impose a limitation on this regard.

In view of the foregoing, in the display apparatus according to the embodiments of the disclosure, the extending portion of the color filter layer or the light shielding pattern is adopted to shield the channel region of the driving transistor. Under the circumstance, the channel region may be prevented from being affected by light, so as to avoid a light leakage current or an offset initial voltage of the driving transistor. The embodiments of the disclosure do not limit the color and the shape of the light shielding pattern, as long as the channel region is able to be prevented from being affected by light to avoid a light leakage current or an offset initial voltage of the driving transistor. The light shielding pattern may continuously extend in the circuit region and may include the plurality of island-like patterns. Furthermore, in the embodiments of the disclosure, the area of the light emitting region, the width of the channel region, or the area of the storage capacitor are taken into consideration to make a suitable optical arrangement for the red, green, and blue color filter patterns. Hence, the display apparatus according to the embodiments of the disclosure renders a desirable quality. Besides, since the light shielding pattern and the color filter layer are manufactured together, no additional manufacturing process is required, or a significant increase in manufacturing cost or time is prevented. Consequently, the display apparatus according to the embodiments has a simpler manufacturing process or a lower manufacturing cost, for example.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A display apparatus, comprising:
   a substrate, having a first light emitting region, a second light emitting region, and a circuit region, wherein the first light emitting region is disposed adjacent to the second light emitting region, and the circuit region is disposed adjacent to the first light emitting region and the second light emitting region;
   a gate line, disposed in the circuit region and extending along a first direction;
   a first driving transistor, disposed in the circuit region and corresponding to the first light emitting region, and the first driving transistor having a first channel region;
   a second driving transistor, disposed in the circuit region and corresponding to the second light emitting region, and the second driving transistor having a second channel region;
   a first color filter layer, having a main portion disposed in the first light emitting region and an extending portion disposed in the circuit region, wherein the main portion is connected to the extending portion;
   a first conductive layer, disposed corresponding to the first driving transistor; and
   a second conductive layer, disposed corresponding to the first driving transistor, wherein the first conductive layer and the second conductive layer have a first overlapped region,
   wherein the extending portion extends along the first direction, and the extending portion overlaps the first channel region and the second channel region,
   wherein a proportion of an area where the extending portion and the first overlapped region are overlapped to an area of the first overlapped region is greater than or equal to 0% and less than or equal to 40%.

2. The display apparatus as claimed in claim 1, wherein the extending portion continuously extends in the circuit region.

3. The display apparatus as claimed in claim 1, wherein the extending portion comprises a plurality of first patterns separated from each other.

4. The display apparatus as claimed in claim 3, wherein the first patterns are located in the circuit region and adjacent to the first light emitting region and the second light emitting region.

5. The display apparatus as claimed in claim 1, further comprising:
   a third driving transistor, disposed in the circuit region and corresponding to a third light emitting region of the substrate, and the third driving transistor having a third channel region; and
   a third color filter layer, disposed in the third light emitting region,
   wherein the first light emitting region is located between the second light emitting region and the third light emitting region.

6. The display apparatus as claimed in claim 5, further comprising a third conductive layer, a fourth conductive layer, a fifth conductive layer, and a sixth conductive layer, the third conductive layer and the fourth conductive layer are disposed corresponding to the second driving transistor, the fifth conductive layer and the sixth conductive layer are disposed corresponding to the third driving transistor, the third conductive layer and the fourth conductive layer have a second overlapped region, and the fifth conductive layer and the sixth conductive layer have a third overlapped region.

7. The display apparatus as claimed in claim 6, wherein the first color filter layer is a red color filter layer, the second color filter layer is a green color filter layer, and the third color filter layer is a blue color filter layer.

8. The display apparatus as claimed in claim 7, wherein an area of the first overlapped region is greater than or equal to an area of the second overlapped region, and an area of the third overlapped region is greater than or equal to the area of the second overlapped region.

9. The display apparatus as claimed in claim 7, wherein an area of the first light emitting region is greater than or equal to an area of the second light emitting region, and an area of the third light emitting region is greater than or equal to the area of the second light emitting region.

10. The display apparatus as claimed in claim 7, wherein a width of the first channel region is greater than or equal to a width of the second channel region, and a width of the third channel region is greater than or equal to the width of the second channel region.

11. The display apparatus as claimed in claim 6, wherein the first color filter layer is a red color filter layer, the second color filter layer is a blue color filter layer, and the third color filter layer is a green color filter layer.

12. The display apparatus as claimed in claim 11, wherein an area of the first overlapped region is greater than or equal to an area of the third overlapped region, and an area of the second overlapped region is greater than or equal to the area of the third overlapped region.

13. The display apparatus as claimed in claim 11, wherein an area of the first light emitting region is greater than or equal to an area of the third light emitting region, and an area of the second light emitting region is greater than or equal to the area of the third light emitting region.

14. The display apparatus as claimed in claim 11, wherein a width of the first channel region is greater than or equal to a width of the third channel region, and a width of the second channel region is greater than or equal to the width of the third channel region.

* * * * *